(12) United States Patent
Pei

(10) Patent No.: US 10,746,350 B2
(45) Date of Patent: Aug. 18, 2020

(54) DISPLAY MOUNTING DEVICE

(71) Applicant: Jun Ma, Shenzhen (CN)

(72) Inventor: Xubo Pei, Shenzhen (CN)

(73) Assignee: Jun Ma, Shenzhen (CN)

( * ) Notice: Subject to any disclaimer, the term of this patent is extended or adjusted under 35 U.S.C. 154(b) by 0 days.

(21) Appl. No.: 16/279,266

(22) Filed: Feb. 19, 2019

(65) Prior Publication Data

US 2020/0208774 A1    Jul. 2, 2020

(30) Foreign Application Priority Data

Dec. 29, 2018  (CN) .......................... 2018 1 1646653
Dec. 29, 2018  (CN) ...................... 2018 2 2278998 U

(51) Int. Cl.
*F16M 13/02*    (2006.01)
*A47B 97/00*    (2006.01)
*H05K 5/02*     (2006.01)

(52) U.S. Cl.
CPC ......... *F16M 13/022* (2013.01); *A47B 97/001* (2013.01); *H05K 5/0204* (2013.01); *F16M 2200/04* (2013.01); *F16M 2200/063* (2013.01)

(58) Field of Classification Search
CPC ...... F16M 13/022; F16M 11/06; F16M 11/12; F16M 11/18; F16M 13/02; F16M 11/045; F16M 11/046; F16M 11/10; F16M 11/048
USPC ........ 248/917, 919, 920, 923, 231.91, 277.1
See application file for complete search history.

(56) References Cited

U.S. PATENT DOCUMENTS

| | | | | |
|---|---|---|---|---|
| 7,950,613 | B2 * | 5/2011 | Anderson | F16M 13/02 248/282.1 |
| 8,693,172 | B2 * | 4/2014 | Russell | F16M 11/10 361/679.01 |
| 2005/0152102 | A1 * | 7/2005 | Shin | F16M 11/2092 361/679.29 |
| 2007/0023599 | A1 * | 2/2007 | Fedewa | F16M 11/10 248/284.1 |
| 2009/0184221 | A1 * | 7/2009 | Sculler | F16M 13/02 248/221.11 |
| 2011/0234926 | A1 * | 9/2011 | Smith | F16M 11/10 348/836 |
| 2013/0032682 | A1 * | 2/2013 | Bell | F16M 11/22 248/277.1 |

\* cited by examiner

*Primary Examiner* — Muhammad Ijaz
(74) *Attorney, Agent, or Firm* — Maier & Maier, PLLC

(57) ABSTRACT

A display mounting device is provided. The display mounting device includes a mounting structure, a pantographic mechanism, and a display fixing structure. The mounting structure is configured to fix to a load-bearing structure of a wall, a cylinder, or a cabinet. The pantographic mechanism includes at least one first linkage assembly configured to be deployable and retractable and at least one second linkage assembly configured to be deployable and retractable in synchronization with the at least one first linkage assembly. Each of the at least one first linkage assembly has two ends respectively rotatably connected with the mounting structure and the display fixing structure, each of the at least one second linkage assembly has two ends respectively rotatably connected with the mounting structure and the display fixing structure.

18 Claims, 7 Drawing Sheets

DISPLAY MOUNTING DEVICE

CROSS REFERENCE TO RELATED APPLICATIONS

The present application claims priority to Chinese Patent Application No. 201811646653.1, filed Dec. 29, 2018, and Chinese Patent Application No. 201822278998.8, filed Dec. 29, 2018, the disclosures of which are hereby incorporated by reference in their entireties.

TECHNICAL FIELD

The present disclosure relates to the field of display mounting accessories, and particularly to a display mounting device.

BACKGROUND

Currently, when mounting a television, mounting holes need be punched in a wall first, a bracket is then mounted to the wall with screws coupled with the mounting holes, and the television is secured to the bracket finally. The limitation of the above-mentioned mounting means is that a structure of the bracket is fixed and non-adjustable, and the television is fixed after being mounted on the bracket. It is incapable of installing plug cables from the back of the television after the television is fixed to the bracket. That is, the current bracket has a single structure and cannot meet the requirements of adjusting distance between the television and the wall.

SUMMARY

The present disclosure is directed to the defects of the prior art, and provides a display mounting device with reasonable structural design and convenient adjustment.

A display mounting device is provided. The display mounting device includes a mounting structure, a pantographic mechanism, and a display fixing structure. The mounting structure is configured to fix to a load-bearing structure of a wall, a cylinder, or a cabinet. The pantographic mechanism includes at least one first linkage assembly configured to be deployable and retractable, and at least one second linkage assembly configured to be deployable and retractable in synchronization with the at least one first linkage assembly. Each of the at least one first linkage assembly has two ends respectively rotatably connected with the mounting structure and the display fixing structure, each of the at least one second linkage assembly has two ends respectively rotatably connected with the mounting structure and the display fixing structure, and a position of the display fixing structure relative to the mounting structure is configured to be adjusted with deployment and retraction of the at least one first linkage assembly and the at least one second linkage assembly.

In the display mounting device of the present disclosure, the first linkage assembly is configured to be deployable and retractable, and the second linkage assembly is configured to be deployable and retractable in synchronization with the first linkage assembly. One end of the first linkage assembly and one end of the second linkage assembly can be connected with the wall via the mounting structure. A display can be amounted on the first linkage assembly and the second linkage assembly via the display fixing structure, such that a position of the display relative to the wall can be adjusted.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description illustrate some embodiments of the present disclosure. Those of ordinary skill in the art may also obtain other drawings based on these accompanying drawings without creative efforts.

DETAILED DESCRIPTION OF ILLUSTRATED EMBODIMENTS

Technical solutions in the embodiments of the present disclosure will be described clearly and completely hereinafter with reference to the accompanying drawings in the embodiments of the present disclosure. Apparently, the described embodiments are merely some rather than all embodiments of the present disclosure. All other embodiments obtained by those of ordinary skill in the art based on the embodiments of the present disclosure without creative efforts shall fall within the protection scope of the present disclosure.

It should be noted that when a component is referred to as being "fixed" to another component, it can be directly connected to another component or can be connected to another component through other intermediate components.

Unless defined otherwise, all technical and scientific terms used herein have the same meaning as commonly understood by one of ordinary skill in the art. The terms used in the description of the present disclosure is for describing particular embodiments and is not intended to limit the present disclosure. The term "and/or" used herein includes any and all combinations of one or more of the associated listed items.

Some embodiments of the present disclosure will be described in detail hereinafter with reference to the accompanying drawings. The features of the embodiments and examples described hereinafter can be combined with each other without conflict.

Figure 1:
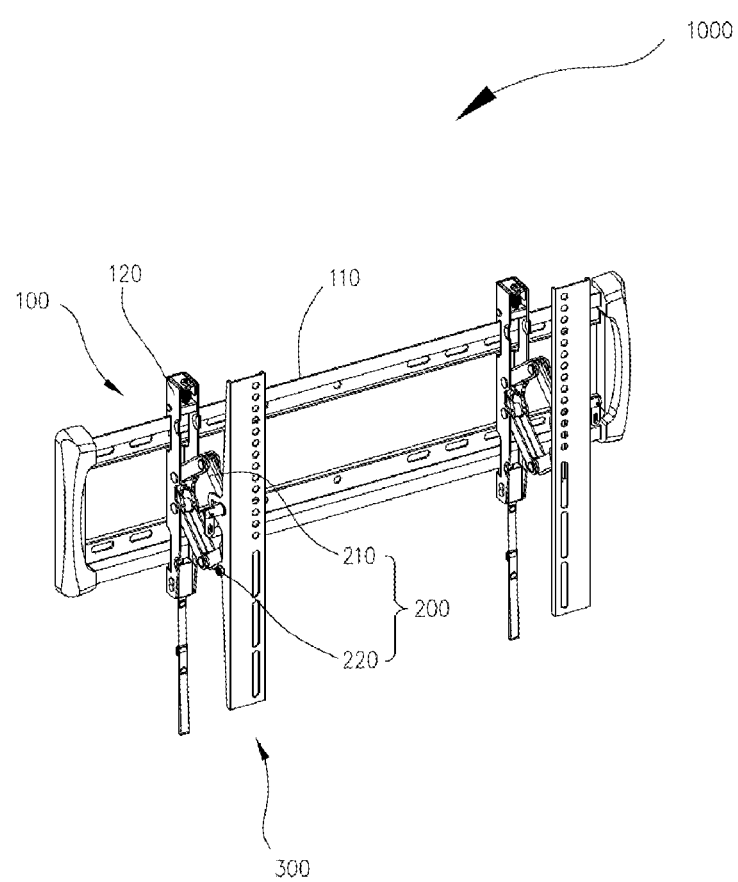
FIG. 1 is a schematic perspective view of a display mounting device according to the present disclose.
Figure 2:
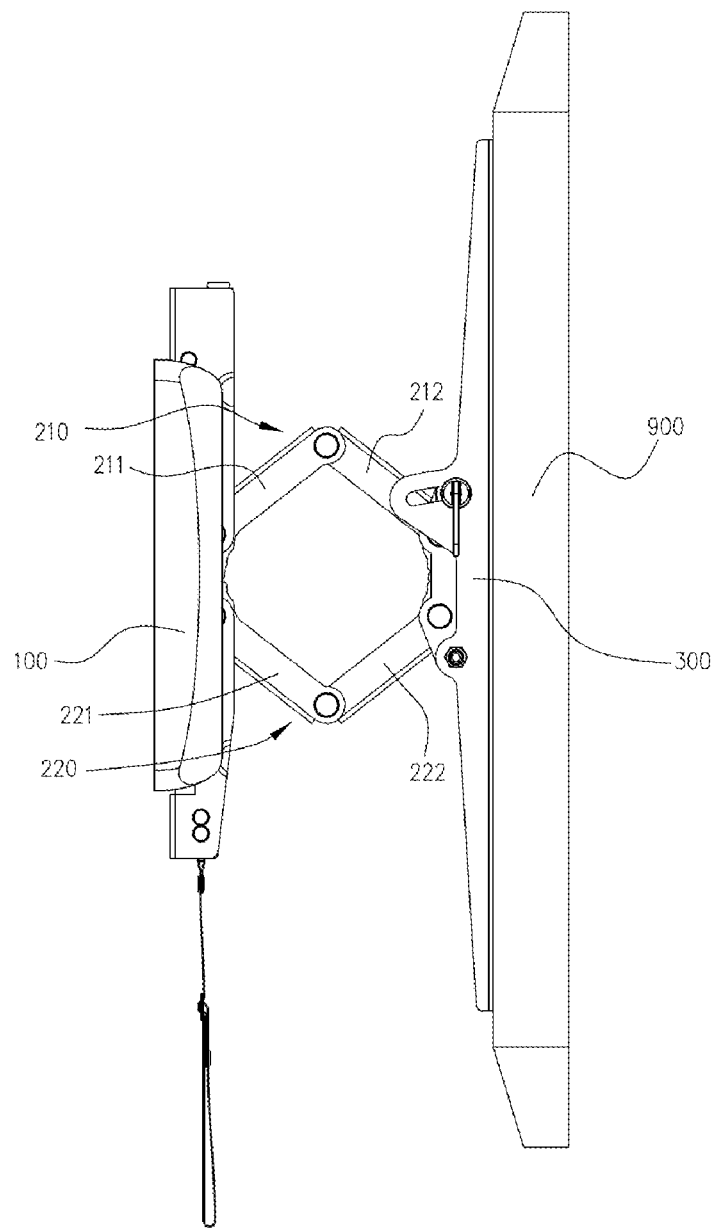
FIG. 2 is a side view of the display mounting device illustrated in FIG. 1.
Figure 3:
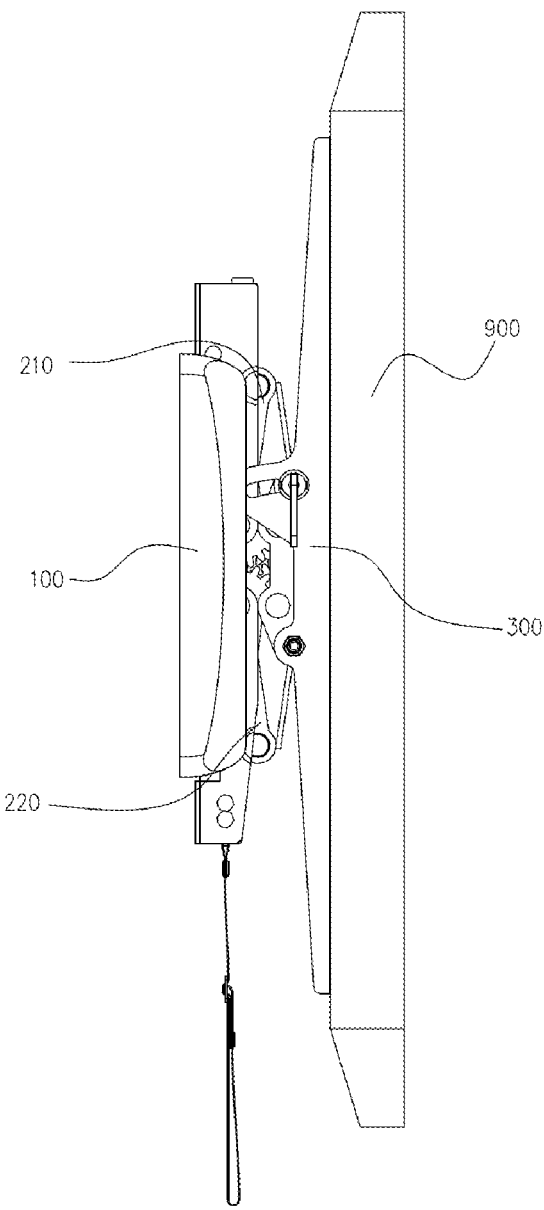
FIG. 3 is a side view of the display mounting device illustrated in FIG. 2 in another state.

Referring FIGS. 1-3, a display mounting device 1000 is provided. The display mounting device 1000 includes a mounting structure 100, a pantographic mechanism 200, and a display fixing structure 300. The mounting structure 100 is configured to fix to a load-bearing structure of a wall, a cylinder, or a cabinet. The pantographic mechanism 200 includes at least one first linkage assembly 210 configured to be deployable and retractable, and at least one second linkage assembly 220 configured to be deployable and retractable in synchronization with the at least one first linkage assembly 210. Each of the at least one first linkage assembly 210 has two ends respectively rotatably connected with the mounting structure 100 and the display fixing structure 300, each of the at least one second linkage assembly 220 has two ends respectively rotatably connected with the mounting structure 100 and the display fixing structure 300, and a position of the display fixing structure 300 relative to the mounting structure 100 is configured to be adjusted with deployment and retraction of the at least one first linkage assembly 210 and the at least one second linkage assembly 220.

It should be understood that, the mounting structure 100 may be fixed to a wall surface of the wall, or may be fixed to a surface of a load-bearing column, or may be fixed to a cabinet body of a decorative cabinet, or fixed on a wall surface of a decorative wall plate. A display 900 can be fixedly mounted on the display fixing structure 300. The display 900 can be an electronic device having a display function such as a flat plate television, a liquid crystal display, a tablet computer, or a display terminal.

The first linkage assembly 210 is configured to be deployable and retractable, and the second linkage assembly 220 is configured to be deployable and retractable in synchronization with the first linkage assembly 210. An end of the first linkage assembly 210 and an end of the second linkage assembly 220 can be connected with the wall via the mounting structure 100. The display 900 can be amounted on the first linkage assembly 210 and the second linkage assembly 220 via the display fixing structure 300, such that a position of the display 900 relative to the wall can be adjusted.

As one embodiment, the mounting structure 100 can be fixed to the wall by fasteners such as screws, bolts, pins, and so on, such that the mounting structure 100 provides a bearing platform for the display fixing structure 300. The mounting structure 100 has a substantially flat structure for facilitating the mounting structure 100 to be amounted in parallel to a surface of the wall, to increase the structural stability of connection between the mounting structure 100 and the wall. The mounting structure 100 has a side surface that can be attached to the wall and another side surface facing away from the wall configured to connect with the pantographic mechanism 200. The display 900 is fixedly connected to the wall via the display fixing structure 300, thereby allowing the display 900 to display information when being amounted on the wall.

In this embodiment, the first linkage assembly 210 may include multiple linkages that are rotatably connected end to end. The multiple linkages of the first linkage assembly 210 includes multiple rotation axes arranged in parallel with each other. When two adjacent linkages of the first linkage assembly 210 are rotated into a folded state, the first linkage assembly 210 is in a retracted state, such that two opposite ends of the first linkage assembly 210 are brought closer together, thereby allowing the display 900 to be brought closer to the wall with the display fixing structure 300. When the two adjacent linkages of the first linkage assembly 210 are rotated into an unfolded state, the first linkage assembly 210 is in a deployed state, such that the two opposite ends of the first linkage assembly 210 are away from each other, thereby allowing the display 900 to be brought away from the wall with the display fixing structure 300. The second linkage assembly 220 may include multiple linkages that are rotatably connected end to end. The multiple linkages of the second linkage assembly 220 includes multiple rotation axes arranged in parallel with each other. Each of the multiple linkages of the second linkage assembly 220 rotates in synchronization with each of the multiple linkages of the first linkage assembly 210, such that the second linkage assembly 220 deploys or retracts in synchronization with the first linkage assembly 210. The synchronous deployment or retraction of the first linkage assembly 210 and the second linkage assembly 220 causes the display fixing structure 300 to be brought away from or close to the mounting structure 100 in a constant direction. That is, the display 900 can move away from or close to the wall in the direction substantially perpendicular to the wall along with the display fixing structure 300. The first linkage assembly 220 and the first linkage assembly 210 can achieve synchronizing drive control by means of damping structures, transmission structures, or articulated structures. The synchronizing linkage of the first linkage assembly 210 and the second linkage assembly 220. The first linkage assembly 210 is synchronized with the second linkage assembly 220, which may also enable the first linkage assembly 210 and the second linkage assembly 220 to provide a stable support for the display fixing structure 300.

In this embodiment, the display fixing structure 300 may be directly connected to the first linkage assembly 210 and the second linkage assembly 220, or may be indirectly connected to the first linkage assembly 210 and the second linkage assembly 220. The display fixing structure 300 may be fixedly connected to the back of the display 900 by screws. A surface of the display fixing structure 300 facing away from the display 900 is connected with the first linkage assembly 210 and the second linkage assembly 220. A distance between the display fixing structure 300 and the mounting structure 100 can be adjusted to increase, thereby allowing a distance between the display 900 and the wall to increase accordingly.

As one embodiment, each of the at least one first linkage assembly 210 includes a first front linkage element 211 rotatably connected with the mounting structure 100 and a first rear linkage element 212 rotatably connected with the first front linkage element 211. Each of the at least one second linkage assembly 220 includes a second front linkage element 221 rotatably connected with the mounting structure 100 and a second rear linkage element 222 rotatably connected with the second front linkage element 221. The display fixing structure 300 is rotatably connected with the first rear linkage element 212 and the second rear linkage element 222.

In this embodiment, an end of the first front linkage element 211 away from the first rear linkage element 212 is rotatably connected with the mounting structure 100, and an end of the second front linkage element 221 away from the second rear linkage element 222 is rotatably connected with the mounting structure 100. The length of the first front linkage element 211 is approximately equal to that of the second front linkage element 221. The first rear linkage element 212 has an end rotatably connected with an end of the first front linkage element 211 away from the mounting structure 100, and another end rotatably connected with the display fixing structure 300. The second rear linkage element 222 has an end rotatably connected with an end of the second front linkage element 221 away from the mounting structure 100, and another end rotatably connected with the display fixing structure 300. The length of the first rear linkage element 212 is approximately equal to that of the second rear linkage element 222. The first front linkage element 211 and the second front linkage element 221 are configured to synchronously rotate with respect to the mounting structure 100, such that the first front linkage element 211 and the second front linkage element 221 can be rotated into a deployed state or a retracted state. After the mounting structure 100 is fixed to the wall, a rotation axis of the first front linkage element 211, a rotation axis of the second front linkage element 221, a rotation axis of the first rear linkage element 212, and a rotation axis of the second rear linkage element 222 are substantially horizontally and laterally disposed. The first front linkage element 211, the first rear linkage element 212, the second rear linkage element 212, and the second rear linkage element 222 are substantially rhombic quadrangular in a vertical plane, such that a structure formed by the first front linkage element 211, the second front linkage element 221, the first rear linkage element The 212 and second rear linkage element 222 is stable in the vertical plane and can withstand the display 900 with a relatively large weight.

Figure 4:
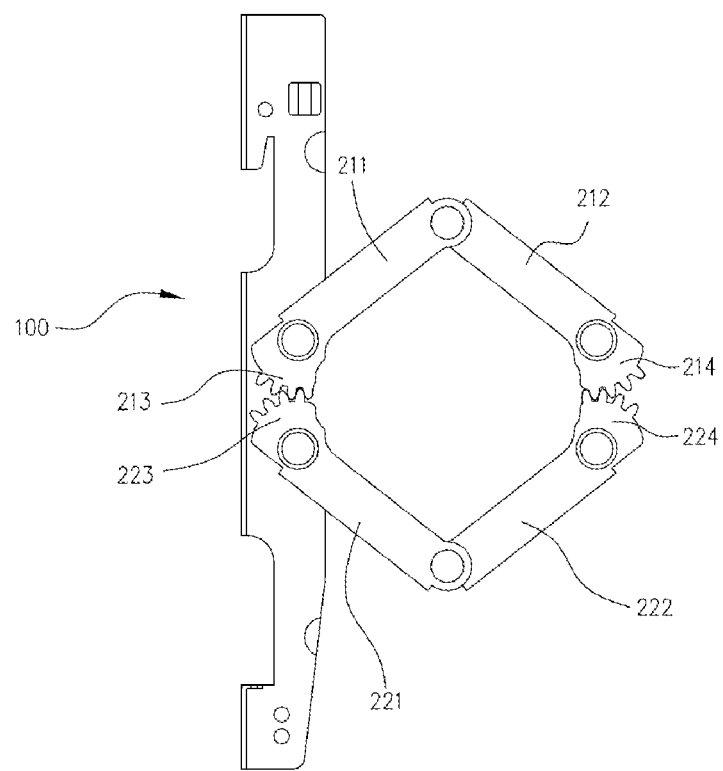
FIG. 4 is a schematic view of a pantographic mechanism of the display mounting device illustrated in FIG. 1.

Referring to FIG. 4, the end of the first front linkage element 211 rotatably connected with the mounting structure 100 is provided with a first front gear 213, the end of the second front linkage element 221 rotatably connected with the mounting structure 100 is provided with a second front gear 223, and the first front gear 213 is engaged with the second front gear 223.

In this embodiment, the first front linkage element 211 includes a first bottom plate 2111 and two first side plates 2112 extending from two sides of the first bottom plate 2111. An end of each of the two first side plates 2112 close to the mounting structure 100 is provided with a first semicircular portion and multiple first teeth on an arcuate side surface of the first semicircular portion. The first front gear 213 includes the first semicircular portions and the first teeth of the two first side plates 2112. As an implementation, the first front linkage element 211 and the mounting structure 100 are rotatably connected via the rotation axis of the first front linkage element 211, and the rotation axis of the first front linkage element 211 is configured to be a rotation axis of the first front gear 213. The second front linkage element 221 includes a second bottom plate 2211 and two second side plates 2212 extending from two sides of the second bottom plate 2211. An end of each of the two second side plates 2212 close to the mounting structure 100 is provided with a second semicircular portion and multiple second teeth extending from an arcuate side surface of the second semicircular portion. The second front gear 223 includes the second semicircular portions and the second teeth of the two second side plates 2212. As an implementation, the second front linkage element 221 and the mounting structure 100 are rotatably connected via the rotation axis of the second front linkage element 221, and the rotation axis of the second front linkage element 221 is configured to be a rotation axis of second front gear 223. An angle at which the first front gear 213 and the second front gear 223 cooperate with each other is ranged from 0° to 90°, such that the first front linkage element 211 has a rotation angle of 0° to 180° with respect to the second front linkage element 221.

As one embodiment, another end of the first rear linkage element 212 rotatably connected with the display fixing structure 300 is provided with a first rear gear 214, another of the second rear linkage element 222 rotatably connected with the display fixing structure 300 is provided with a second rear gear 224, and the first rear gear 214 is engaged with the second rear gear 224.

In this embodiment, another end of the first rear linkage element 212 rotatably connected with the display fixing structure 300 (that is, the end of the first rear linkage element 212 away from the first front linkage element 211) is provided with a first semicircular body and multiple third teeth extending from the first semicircular body. The first rear gear 214 includes the first semicircular body and the multiple third teeth. Another end of the second rear linkage element 222 rotatably connected with the display fixing structure 300 (that is, the end of the second rear linkage element 222 away from the second front linkage element 221) is provided with a second semicircular body and multiple fourth teeth extending from the second semicircular body. The second rear gear 224 includes the second semicircular body and the multiple fourth teeth. As one implementation, the thickness of the first rear gear 214 is greater than that of the first front gear 213, such that the resistance to mechanical stresses of the first rear gear 214 is greater than that of the first front gear 213. The thickness of the second rear gear 224 is greater than that of the second front gear 223, such that the resistance to mechanical stresses of the second rear gear 224 is greater than that of the second front gear 223. As a result, the structural stability of the connection between the pantographic mechanism 200 and the display fixing structure 300 is enhanced, thereby allowing the display fixing structure 300 to carry the display 900 with a large weight.

Figure 6:
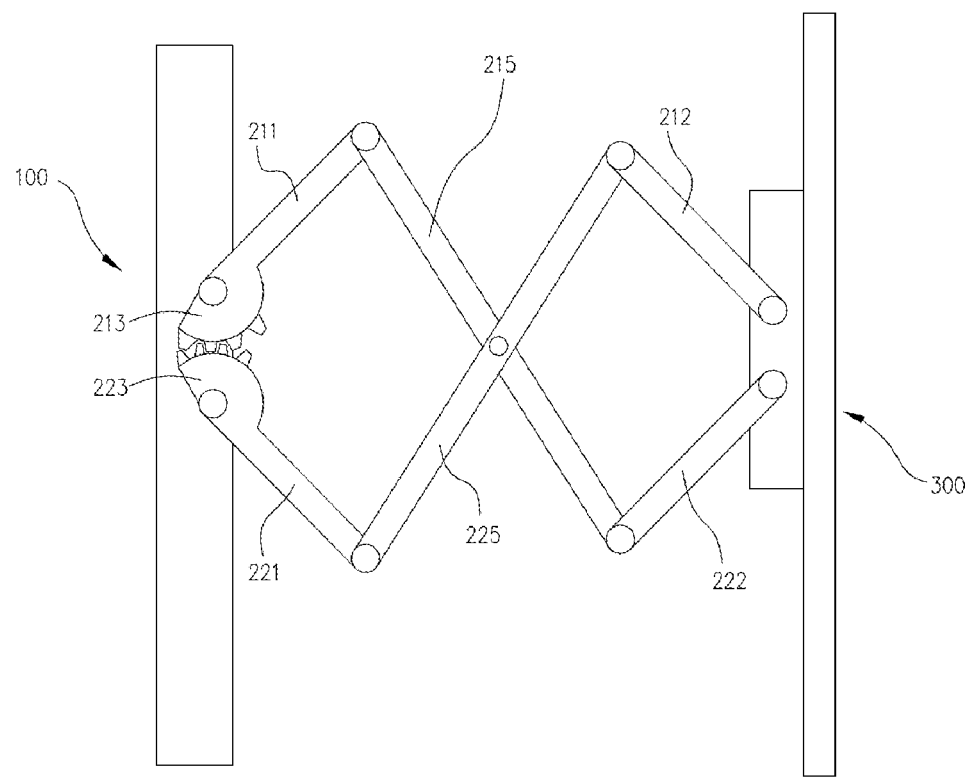
FIG. 6 is a schematic view of a display mounting device according to another embodiment of the present disclosure.

Referring to FIG. 6, each of the at least one first linkage assembly 210 further includes at least one first intermediate linkage element 215 rotatably connected with the first front linkage element 211 and the first rear linkage element 212, each of the at least one second linkage assembly 220 further includes at least one second intermediate linkage element 225 rotatably connected with the second front linkage element 221 and the second rear linkage element 222, and each of the at least one first intermediate linkage element 215 js rotatably connected with each of the at least one second intermediate linkage element 225 correspondingly.

As one implementation, the first linkage assembly 210 further includes one first intermediate linkage element 215, and two ends of the first intermediate linkage element 215 are respectively rotatably connected to the end of the first front linkage element 211 away from the mounting structure 100 and an end of the second rear linkage element 222 away from the display fixing structure 300. The second linkage assembly 220 further includes a second intermediate linkage element 225, and two ends of the second intermediate linkage element 225 are respectively rotatably connected to the end of the second front linkage element 221 away from the mounting structure 100 and an end of the first rear linkage element 212 away from the display fixing structure 300. A middle portion of the first intermediate linkage element 215 is rotationally connected with a middle portion of the second intermediate linkage element 225. A rotation axis of the first intermediate linkage element 215 is parallel to the rotation axis of the first front linkage element 211. A rotation axis of the second intermediate linkage element 225 is parallel to the rotation axis of the second front linkage element 221. When the first front linkage element 211, the first intermediate linkage element 215, and the first rear linkage element 212 are sequentially deployed, the second front linkage element 221, the second intermediate linkage element 225, and the second rear linkage element 222 are sequentially deployed in synchronization with the first front linkage element 211, the first intermediate linkage element 215, and the first rear linkage element 212, so as to realize a movement of the display fixing structure 300 in a direction away from the mounting structure 100. When the first front linkage element 211, the first intermediate linkage element 215, and the first rear linkage element 212 are sequentially retracted, the second front linkage element 221, the second intermediate linkage element 225, and the second rear linkage element 222 are sequentially retracted in synchronization with the first front linkage element 211, the first intermediate linkage element 215, and the first rear linkage element 212, so as to realize a movement of the display fixing structure 300 in a direction toward the mounting structure 100. Of course, in other embodiments, multiple first intermediate linkage element 215 may also be rotatably connected end to end between the first front linkage element 211 and the second rear linkage element 222, and multiple second intermediate linkage elements 225 may also be rotatably connected end to end between the second front linkage element 221 and the first rear linkage element 212.

Figure 5:
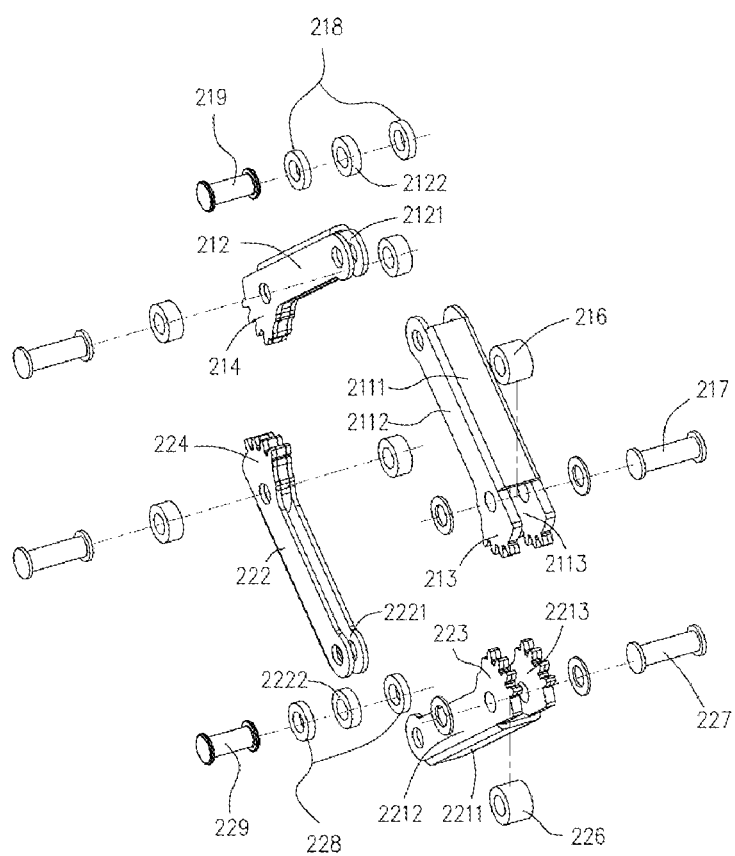
FIG. 5 is an exploded perspective view of the pantographic mechanism of the display mounting device illustrated in FIG. 1.

Referring to FIGS. 4 and 5, the first front linkage element 211 has a first groove 2113, and an end of the first rear linkage element 212 rotatably connected with the first front linkage element 211 (that is, the end of the first rear linkage element 212 away from the display fixing structure 300) is received in the first groove 2113. The second front linkage element 221 has a second groove 2113, and an end of the second rear linkage element 222 rotatably connected with the second front linkage element 221 (that is, the end of the second rear linkage element 222 away from the display fixing structure 300) is received in the second groove 2213.

In this embodiment, the two first side plates 2112 and the first bottom plate 2111 define the first groove 2113. The first groove 2113 extends from the end of the first front linkage element 211 rotatably connected with the mounting structure 100 to another end of the first front linkage element 211 rotatably connected with the first rear linkage element 221. Owing to this arrangement that the first front linkage element 211 has the first groove 2113, on the one hand, the weight of the first front linkage element 211 can be reduced, so as to reduce the load of the mounting structure 100 and, on the other hand, when the first front linkage element 211 and the first rear linkage element 212 are rotated into the retracted state, and the first rear linkage element 212 can be substantially accommodated in the first groove 2113, such that an angle formed between the first front linkage element 211 and the first rear linkage element 212 can be small, that is, the display fixing structure 300 can be supported at a position close to the mounting structure 100.

The two second side plates 2212 and the second bottom plate 2211 define the second groove 2213. The second groove 2213 extends from the end of the second front linkage element 221 rotatably connected with the mounting structure 100 to another end of the second front linkage element 221 rotatably connected with the second rear linkage element 222. Owing to this arrangement that the second front linkage element 221 has the second groove 2213, on the one hand, the weight of the second front linkage element 221 can be reduced, so as to reduce the load of the mounting structure 100 and, on the other hand, when the second front linkage element 221 and the second rear linkage element 222 are rotated into the retracted state, and the second rear linkage element 222 can be substantially accommodated in the second groove 2213, such that an angle formed between the second front linkage element 221 and the second rear linkage element 222 can be small, that is, the display fixing structure 300 can be supported at a position close to the mounting structure 100.

As one embodiment, each of the at least one first linkage assembly 210 includes a first front spacer 216 received in the first groove 2113 and a first front pin 217 extending through the first front linkage element 211 and the first front spacer 216, and the first front pin 217 is rotatably connected with the mounting structure 100. Each of the at least one second linkage assembly 220 includes a second front spacer 226 received in the second groove 2213 and a second front pin 227 extending through the second front linkage element 221 and the second front spacer 226, and the second front pin 227 is rotatably connected with the mounting structure 100.

In this embodiment, the first front spacer 216 may be made of rubber. The first front spacer 216 has elastic properties. Two ends of the first front spacer 216 respectively abut against inner sides of the two first side plates 2112. The first front spacer 216 disposed between the two first side plates 2112 can provide support for the two first side plates 2112 to prevent the two first side plates 2112 from being deformed under pressure. The first front pin 217 may be a rivet. Two ends of the first front pin 217 are provided with two rivet caps. The first front pin 217 extends through the two first side plates 2112, and the two rivet caps of the first front pin 217 are in contact with outer sides of the two first side plates 2112, thereby avoiding the first front pin 217 from being separated from the first front linkage element 211 and the mounting structure 100. The two rivet caps disposed on the two ends of the first front pin 217 apply a preload (that is, a pre-clamping force) on the first side plates 2112, such that clearance gaps between the two ends of the first front pin 217 and the first front linkage element 211 are small, resulting that the first front linkage element 211 can rotate more smoothly with respect to the mounting structure 100. The first front pin 217 is configured as a rotating shaft for rotatably connect the first front linkage element 211 and the mounting structure 100. The first front spacer 216 is disposed around a middle portion of the first front pin 217 to avoid the first front pin 217 from being damaged.

In this embodiment, the second front spacer 226 may be made of rubber. The second front spacer 226 has elastic properties. Two ends of the second front spacer 226 respectively abut against inner sides of the two second side plates 2212. The second front spacer 226 disposed between the two second side plates 2212 can provide support for the two second side plates 2212 to prevent the two second side plates 2212 from being deformed under pressure. The second front pin 227 may be a rivet. Two ends of the second front pin 227 are provided with two rivet caps. The second front pin 227 extends through the two second side plates 2212, and the two rivet caps of the second front pin 227 are in contact with outer sides of the two second side plates 2212, thereby avoiding the second front pin 227 from being separated from the second front linkage element 221 and the mounting structure 100. The two rivet caps disposed on the two ends of the second front pin 227 apply a preload (that is, a pre-clamping force) on the two second side plates 2212, such that clearance gaps between the two ends of the second front pin 227 and the second front linkage element 221 are small, resulting that the second front linkage element 221 can rotate more smoothly with respect to the mounting structure 100. The second front pin 227 is configured as a rotation shaft for rotatably connecting the second front linkage element 221 and the mounting structure 100. The second front spacer 226 is disposed around a middle portion of the second front pin 227 to avoid the second front pin 227 from being damaged.

As one embodiment, each of at least one first linkage assembly 210 includes two first intermediate spacers 218 received in the first groove 2113 and a first intermediate pin 219, the end of the first rear linkage element 212 rotatably connected with the first front linkage element 211 is clamped between the two first intermediate spacers 218, and the first intermediate pin 219 extends through the first front linkage element 211, the first rear linkage element 212, and the two first intermediate spacers 218. Each of at least one second linkage assembly 220 includes two second intermediate spacers 228 received in the second groove 2213 and a second intermediate pin 229, the end of the second rear linkage element 222 rotatably connected with the second front linkage element 221 is clamped between the two second intermediate spacers 228, and the second intermediate pin 229 extends through the second front linkage element 221, the second rear linkage element 222, and the two second intermediate spacers 228.

In this embodiment, the first intermediate spacers 218 are respectively disposed between each of the two first side plates 2112 and the first rear linkage element 212 to prevent the first rear linkage element 212 and the first front linkage element 211 from being damaged by friction. The first intermediate spacers 218 can be rubber ring. The first intermediate spacers 218 may absorb a clamping force of the first side plates 2112 to the first rear linkage element 212, such that the first front linkage element 211 and the first rear linkage element 212 are rotationally connected with each other more smoothly. The first intermediate pin 219 is configured as a rotation shaft for rotatably connecting the first front linkage element 211 and the first rear linkage element 212. A structure of the first intermediate pin 219 is substantially the same as that of the first front pin 217, and details will not be described herein again. A structure of the second intermediate spacer 228 is substantially the same as that of the first intermediate spacers 218, and details will not be described herein again. The second intermediate pin 229 is configured as a rotation shaft for rotatably connected with the second front linkage element 221 and the second rear linkage element 222. A structure of the second intermediate pin 229 is substantially the same as that of the first rotating pin 219, and details will not be described herein again.

As one embodiment, the first rear linkage element 212 has a third groove 2121, each of the at least one first linkage assembly 210 further includes a third intermediate spacer 2122 received in the third groove 2121. The first intermediate pin 219 also extends through the third intermediate spacer 2122. The second rear linkage element 222 has a fourth groove 2221, each of the at least one second linkage assembly 220 further includes a fourth intermediate spacer 2222 received in the fourth groove 2221, and the second intermediate pin 229 also extends through the fourth intermediate spacer 2222.

As one embodiment, the third groove 2121 extends from one end of the first rear linkage element 212 to the other end of the first rear linkage element 212 to reduce the weight of the first rear linkage element 212. The third groove 2121 is configured to provide a deformation space for a portion of the first rear linkage element 212 where the first rear linkage element 212 is rotatably connected with the first front linkage element 211, such that the first front linkage element 211 and the first rear linkage element 212 can be fit tightly. Two ends of the third intermediate spacer 2122 abut against the opposite inner side walls of the third groove 2121. The third intermediate spacer 2122 is utilized to reinforce the structure strength of a portion of the first rear linkage element 212 in which the first rear linkage element 212 is rotatably connected with the first intermediate pin 219, so as to prevent the first rear linkage element 212 from being damaged and the rotation between the first rear linkage element 212 and the first front linkage element 211 from being affected. The fourth groove 2221 extends from one end of the second rear linkage element 222 to the other end of the second rear linkage element 222 to reduce the weight of the second rear linkage element 222. The fourth groove 2221 is configured to provide a deformation space for a portion of the second rear linkage element 222 where the second rear linkage element 222 is rotatably connected with the second front linkage element 221, such that the second front linkage element 221 and the second rear linkage element 222 can be fit tightly. The structure of the fourth intermediate spacer 2222 is substantially the same as that of the third intermediate spacer 2212, and details are not described herein again.

Figure 7:
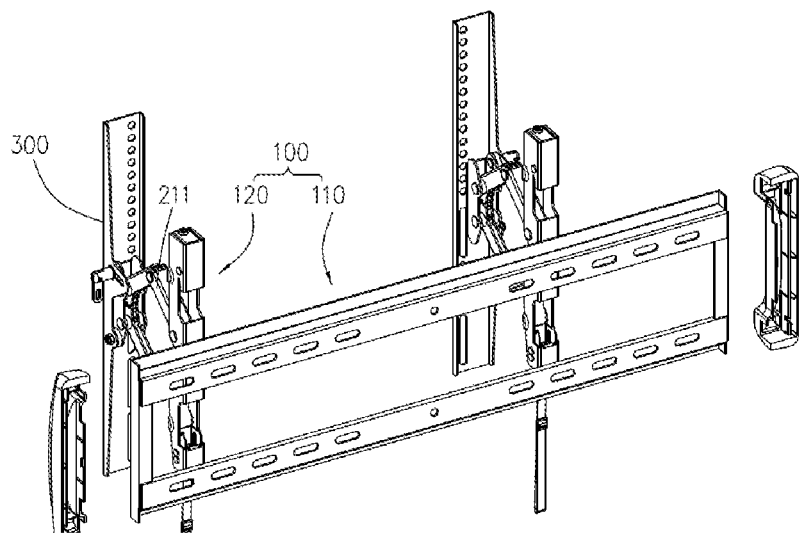
FIG. 7 is a schematic perspective view of the display mounting device illustrated in FIG. 1.
Figure 8:
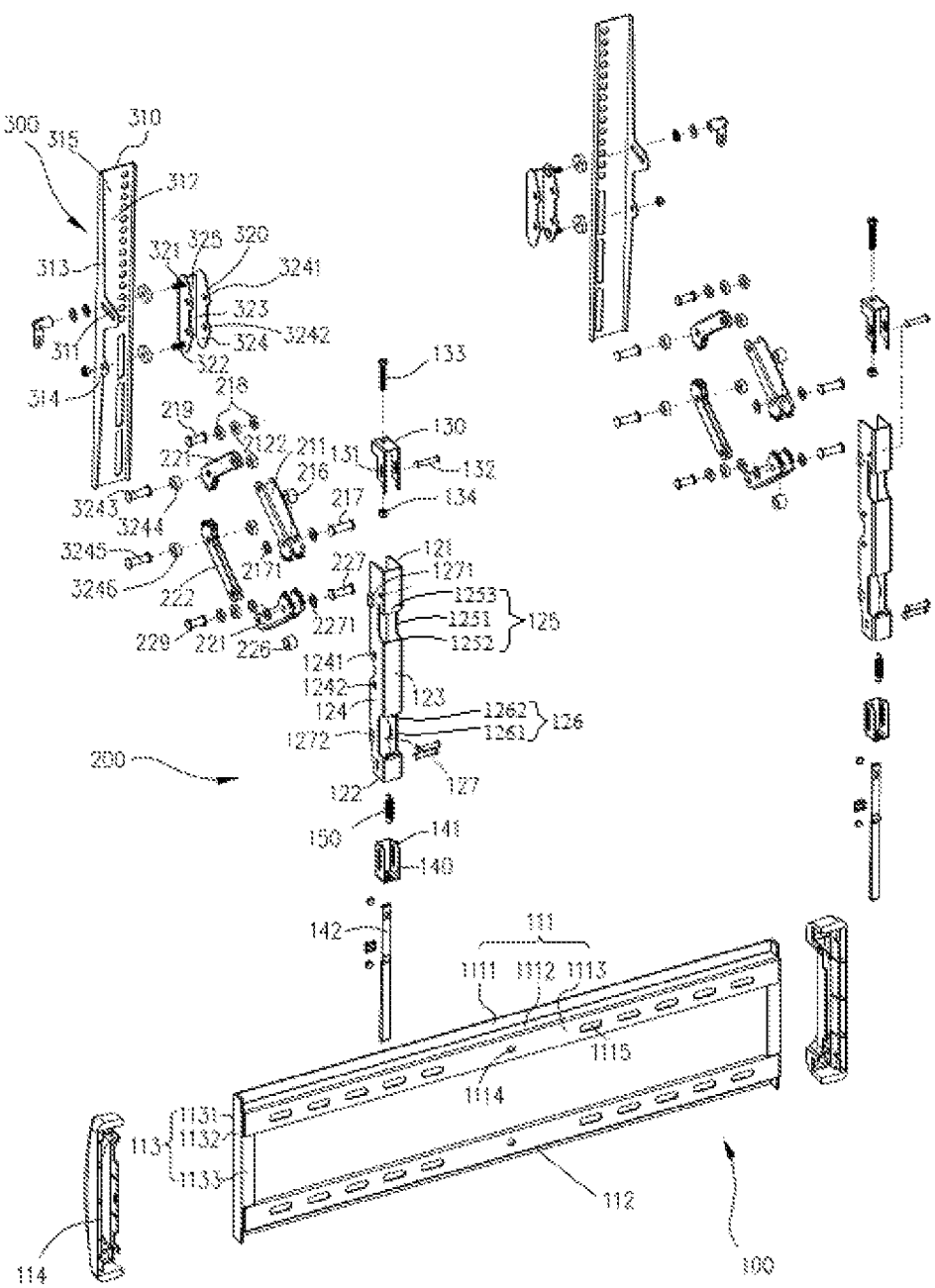
FIG. 8 is another schematic perspective view of the display mounting device illustrated in FIG. 1.

Referring to FIGS. 7-8, the mounting structure 100 includes a frame 110 and two fixing members 120 detachably connected with the frame 110. The frame 110 is configured to be fixed to the load-bearing structure of the wall, the cylinder, or the cabinet. Two first linkage assemblies 210 are provided to respectively rotatably connect with the two fixing members 120, and two second linkage assemblies 220 are provided to respectively rotatably connect with the two fixing members 120.

In this embodiment, the frame 110 is substantially in the form of a rectangular structure. The frame 110 provides load-bearing support for the two fixing members 120. The frame 110 is manufactured by stamping and bending a steel plate. The frame 110 has a stable structure and is relatively light, thereby facilitating the securement and mounting of the frame 110 to the wall. Each of the two fixing member 120 is in a substantially rod shape. The longitudinal direction of each of the two fixing members 120 is perpendicular to the rotation axis of the first front linkage element 211 and perpendicular to the rotation axis of the second front linkage element 221. The first front linkage element 211 can be rotated to be deployed or retracted relative to the fixing member 120. The second front linkage element 221 can be rotated to be deployed or retracted relative to the first front linkage element 211 in synchronization with the first front linkage element 211. The fixing member 120 is detachably connected with the frame 110, facilitating quick installation or quick disassembly of the display 900. Specifically, the frame 110 can be fixed on the wall first. Then, the display 900 is connected to the display fixing structure 300. Finally, the display 900, the display fixing structure 300, the pantographic mechanism 200 and the fixing member 120 connected to the display fixing structure 300 are quickly installed to the frame 110. When the display 900 needs to be quickly removed from the wall, the fixing member 120 can be directly removed from the frame 110. The two fixing members 120, the two pantographic mechanisms 200, and the two display fixing structures 300 can achieve stable support for the display 900.

More specifically, the fixing member 120 has a first connection end 121 and a second connection end 122 disposed opposite to the first connection end 121. The first connection end 121 and the second connection end 122 can respectively connect a top portion and a bottom portion of the mounting structure 100. The fixing member 120 includes a main body plate 123 and two side plates 124 that are bent and extended from opposite two edges of the main body plate 123. Each of the two side plates 124 extends in parallel to the longitudinal direction of the fixing member 120. The fixing member 120 is provided with a first hole 1241 and a second hole 1242 extending through the two side plates 124 at a position between the first connection end 121 and the second connection end 122. The first hole 1241 and the second hole 1242 are arranged side by side, and the first hole 1241 is closer to the first connection end 121 than the second hole 1242. A first pin 217 extends through the first hole 1241. The first pin 217 has two pin caps respectively abutted against the outer sides of the two side plates 124. The two side plates 124 clamp the end of the first front linkage element 211 away from the first rear linkage element 212. A second pin 227 extends through the second hole 1242. The second pin 227 has two pin caps respectively abutted against the outer sides of the two side plates 124. The first pin 217 also extends through two first washers 2171, and the two first washers 2171 are disposed between each of the two side plates 124 and the first front linkage element 211. The two first washers 2171 are configured to prevent the two side plates 124 from rubbing against the first front linkage element 211. The second pin 217 also extends through two second washers 2271, and the two second washers 2271 are disposed between each of the two side plates 124 and the second front linkage element 221. The two second washers 2271 are configured to prevent the two side plates 124 from rubbing against the second front linkage element 221.

As one embodiment, the frame 110 includes a first beam 111 and a second beam 112 disposed opposite the first beam 111, and two opposite vertical rods 113 fixedly connected to the first beam 111 and the second beam 112. Each of the two fixing member 120 has an end provided with a hook 125 configured to be mounted to the first beam 111, and another end provided with a recess 126 configured to be engaged with the second beam 112.

In this embodiment, the first beam 111, the second beam 112, and the vertical rods 113 are integrally formed. As one implementation, the first beam 111 and the second beam 112 are disposed in a horizontal direction, and the vertical rods 113 are disposed in a vertical direction. The first beam 111 includes a first plate 1111, a second plate 1112, and a third plate 1113. The second plate 1112 extends, in a direction perpendicular to the first plate 1111, from a long edge of the first plate 1111 close to the second beam 112. The third plate 1113 extends, in a direction perpendicular to the second beam 112 and approaching to the second beam 112, from a long edge of the second beam 112 away from the first plate 1111. The first plate 1111, the second plate 1112, and the third plate 1113 are integrally formed. The third plate 1113 is parallel to the first plate 1111. The third plate 1113 has a first hole 1114 and multiple first slots 1115. The third plate 1113 can be fixed to the wall through the first hole 1114 and the multiple first slots 1115, and can be firmly attached to the wall surface of the wall. There is a gap between the first plate 1111 and the wall surface of the wall, so that the hook 125 of the first connection end 121 can be mounted to the first plate 1111. The structure of the second beam 112 is substantially the same as that of the first beam 111, and will not be described herein. The recess 126 of the second connection end 122 can engage with the first plate 1111 of the second beam 112 to stabilize the fixing member 120 and the frame 110.

Each of the two vertical rods 113 include a first plate 1131, a second plate 1132, and a third plate 1133. The second plate 1132 extends, in a direction perpendicular to the first plate 1131, from a long edge of the first plate 1231. The third plate 1133 extends, in a direction perpendicular to the second plate 1132 and approaching to another vertical rod 113, from a long edge of the second plate 1132 away from the first plate 1131. The first plate 1131, the second plate 1132, and the third plate 1133 are integrally formed. The first plate 1131 is connected to an edge of an end of the first plate 1111 and is integrally formed with the first plate 1111. The first plate 1131 bents relative to the first plate 1111 and disposed substantially perpendicular to the first plate 1111. The third plate 1133 is disposed in parallel with the first plate 1111. An end portion of the third plate 1113 in the longitudinal direction is overlapped with an end portion of the third plate 1133. The third plate 1133 is disposed on a side of the third plate 1113 close to the first plate 1111. The first beam 111, the second beam 112 and the vertical rods 113 are integrally formed, so that the frame 110 has a stable structure and strong bearing performance.

The hook 125 is formed at the first connection end 121, and the recess 126 is formed at the second connection end 122. Each of the two side plates 124 has a first opening 1251 disposed at the first connection end 121, and the main body plate 123 has a second opening 1252 disposed at the first connection end 121. The first opening 1251 is communicated with the second opening 1252. The first opening 1251 has an end extends from the second opening 1252 of the main body plate 123 and another end extends below the main body plate 123, that is, a protruding portion 1253 extending from the two side plates 124 and the main body plate 123 is disposed above the first opening 1251. As illustrated in FIG. 4 and FIG. 8, two first openings 1251, the second opening 1252, and the protruding portion 1253 are configured as the hook 125. Each of the two side plates 124 has a third opening 1261 disposed at the second connection end 122, and the main body plate 123 has a fourth opening 1262 disposed at the second connection end 122. The two third openings 1261 and the fourth opening 1262 are configured as a recess 126. The hook 125 can be mounted on the first beam 111, so that the fixing member 120 can be quickly installed to the frame 110. Positions of the two fixing members 120 on the first beam 111 can be adjusted in the horizontal direction, so that a position of the display 900 can be adjusted in the horizontal direction with the display fixing structure 200. With the two fixing members 120, two ends of the frame 110 can be respectively fixed to the two load-bearing columns of the wall, and the two load-bearing columns is provided with load-bearing structures. The center of gravity of the display 900 is positioned between the two load-bearing columns, and the weight of the display 900 is equally balanced by the frame 110, so that the overall structure is stabilized.

The frame 110 further includes two plastic covers 114. The two plastic covers 114 cover the two vertical rods 113 and engage with the two vertical rods 113, respectively. The plastic covers 114 are used to increase the appearance performance of the frame 110, thereby facilitating the holding and installation of the frame 110.

As one embodiment, the mounting structure 100 further includes a displacement adjustment member 130 connected to the fixing member 120 to be slidable in the longitudinal direction of the fixing member 120, the displacement adjustment member 130 is configured to be abutted against the first beam 111, and a position of the fixing member 120 relative to the mounting structure 100 is configured to be adjusted by adjusting a position of the displacement adjustment member 130 relative to the fixing member 120.

In this embodiment, the displacement adjustment member 130 is provided with two displacement adjustment grooves 131. The longitudinal direction of each of the two displacement adjustment grooves 131 is in parallel to the longitudinal direction of the fixing member 120. The fixing member 120 is provided with a limiting rod 132 extending through the two displacement adjustment grooves 131. An end of the displacement adjustment member 130 close to the first connection end 121 is provided with an adjustment screw 133. One end of the adjustment screw 133 is screwed to a platform of the first connection end 121 via an adjustment nut 134. By rotating the adjustment screw 133, the displacement adjustment member 130 is moved along the longitudinal direction of the fixing member 120, such that the fixing member 120 can be displaced in a direction perpendicular to the first beam 111, thereby achieving fine adjustment of the level of the display 900 in the horizontal direction.

As one embodiment, the mounting structure 100 further includes a retaining member 140 connected to the fixing member 120 to be slidable in the longitudinal direction of the fixing member 120 and an elastic member 150 elastically connected between the fixing member 120 and the retaining member 140. The retaining member 140 is configured to abut against the second beam 112 under the elastic force of the elastic member 150.

In this embodiment, the retaining member 140 is disposed at the second connection end 122. The retaining member 140 is configured to slidely move between the two side plates 124. The retaining member 140 is provided with a hook member 141. The hook member 141 can be used to block the recess 126. An end of the retaining member 140 close to the second connection end 122 is provided with an unlocking string 142. When a user pulls down the unlocking string 142, the retaining member 140 is driven to slide toward the second connection end 122, and the hook member 141 is moved a position where the recess 126 is not blocked by the hook member 141, such that the second beam 112 can be removed from the recess 126, and the fixing member 120 can be separated from the frame 110. When the user releases the unlocking string 142, the retaining member 140 is driven to slide away from the second connection end 122 under an elastic restoring force of the elastic member 150, and the hook member 141 is moved to block the recess 126 and prevents the second beam 112 inserted into the recess 126 from being removed from the recess 126, so that the fixing member 120 can be stably connected to the frame 110.

As one embodiment, the fixing member 120 has a groove 127, and the end of the first front linkage element 211 rotatably connected with the mounting structure 100 and the end of the second front linkage element 221 rotatably connected with the mounting structure 100 are received in the groove 127. Another end of the first front linkage element 211 rotatably connected with the first rear linkage element 221 is at least partially received in the groove 127 and another end of the second front linkage element 221 rotatably connected with the second rear linkage element 222 is at least partially received in the groove 127, in a retracted state of the at least one first linkage assembly 210 and the at least one second linkage assembly 220.

In this embodiment, the two side plates 124 and main body plate 123 define the groove 127. An inner side of each of the two side plates 124 is provided with a first recess 1271 close to the first connection end 121, and a second recess 1272 close to the second connection end 122. When the first front linkage element 211 is in the retracted state relative to the fixing member 120, the two first recesses 1271 can receive pin caps of the first intermediate pin 219. When the second front linkage element 221 is in the retracted state relative to the fixing member 120, the two second recesses 1272 can receive pin caps of the second intermediate pin 229. In this way, a folding angle defined by the first front linkage element 211 and the fixing member 120 can be small, and a folding angle defined by the second front linkage element 221 and the fixing member 120 can be small, such that the display fixing structure 300 can be disposed closer to the mounting structure 100.

As one embodiment, the display fixing structure 300 includes two supporting members 310 arranged in parallel, each of the two supporting members 310 is configured to fixedly connect with the display 900. The two supporting members 310 is respectively rotatably connected with an end of each of the at least one first linkage assembly 210 away from the mounting structure 100 and an end of each of the at least one the second linkage assembly 220 away from the end of the mounting structure 100. The longitudinal direction of each of the two supporting members 310 is perpendicular to at least one rotation axis of each of the at least one the first linkage assembly 210.

In this embodiment, the two supporting members 310 support the display 900 to achieve stability of the display 900. The first rear linkage element 212 and the second rear linkage element 222 are rotatably connected to a middle portion of each of the two supporting members 310, and the middle portion is positioned between two ends of each of the two supporting members 310. The two ends of each of the two supporting members 310 are configured to connect the display 900 by screws.

As one embodiment, the display fixing structure 300 further includes two tilting adjustment seats 320. Each of the two tilting adjustment seats 320 is rotatably connected with an end of the first rear linkage element 212 away from the mounting structure 100 and an end of the second rear linkage element 222 away from the mounting structure 100 respectively at two positions between two ends of each of the two tilting adjustment seats 320. An end of each of the two tilting adjustment seats 320 close to the second rear linkage element 222 is rotatably connected with the supporting member 310, another end of each of the two tilting adjustment seats 320 close to the first rear linkage element 212 is configured to deploy and retract relative to the supporting member 310, such that a tilting position of the supporting member 310 relative to the tilting adjustment seat 320 is adjustable.

As one embodiment, each of the two supporting members 310 is provided with an arcuate slot 311, and each of the two tilting adjustment seats 320 is provided with a pin 321 slidably coupled to the arcuate slot 311. The supporting member 310 includes a support bottom plate 312 and a support side plate 313 extends from the support bottom plate 312 in a direction perpendicular to the support bottom plate 312. The support side plate 313 is provided with an adjustment hole 314, and the tilting adjustment seat 320 is rotatably connected to the support side plate 313 through the adjustment hole 314. One end of the tilting adjustment seat 320 is provided with an adjustment shaft 322 extending through the adjustment hole 314. The adjustment shaft 322 is disposed in parallel with the pin 321. The adjustment shaft 322 and the pin 321 are respectively disposed at opposite ends of the tilting adjustment seat 320. The tilting adjustment seat 320 can be rotated relative to the supporting member 310 by the adjustment shaft 322. A tilting angle of tilting adjustment seat 320 relative to the supporting member 310 can be adjusted by the pin 321. The tilting angle of the supporting member 310 can be adjusted from 2° to 15° with respect to the vertical plane by the tilting adjustment seat 320.

As one embodiment, the tilting adjustment seat 320 includes a bottom plate 323 and two side plates 324 disposed at opposite edges of the bottom plate 323. A groove 325 is defined by the bottom plate 323 and the two side plates 324 of the tilting adjustment seat 320. The end of the first rear linkage element 212 away from the mounting structure 100 (that is, an end of the first rear linkage element 212 away from the first front linkage element 211) and the end of the second rear linkage element 222 away from the mounting structure 100 (that is, an end of the second rear linkage element 222 away from the second front linkage element 221) are received in the groove 325. Each of the two side plates 324 is provided with a first hole 3241 and a second hole 3242. The first rear linkage element 212 is provided with a first rear pin 3243 extending through the first hole 3241. Two pin caps of the first rear pin 3243 respectively abut against outer sides of the two side plates 324. Two first rear spacers 3244 are respectively disposed between each of the two side plates 324 and the first rear linkage element 212. The first rear pin 3243 also extends through the two first rear spacers 3244. The second rear linkage element 222 is provided with a second rear pin 3245 extending through the second hole 3242. Two pin caps of the second rear pin 3245 respectively abut against the outer sides of the two side plates 324. Two second rear spacers 3246 are respectively disposed between each of the two side plates 324 and the second rear linkage element 222. The second rear pin 3245 also extends through the two second rear spacers 3246.

As one embodiment, each of the two supporting member 310 is provided with a supporting groove 315, and the end of the tilting adjustment seat 320 rotatably connected with the supporting member 310 is received in the supporting groove 315. The bottom plate 323 can be rotated to be into close contact with the support bottom plate 312. When the first front linkage element 211 and the first rear linkage element 221 are driven into the retracted state, the first rear linkage element 221 is folded with respect to the supporting member 310, such that an angle defined by the first rear linkage element 221 and the supporting member 310 is small, and the distance between the display 900 and the wall can be further decreased.

The first linkage assembly 210 can be deployed or retracted, and the second linkage assembly 220 can be deployed or retracted in synchronization with the first linkage assembly 210. One end of the first linkage assembly 210 and one end of the second linkage assembly 220 can be connected to the wall through the mounting structure 100, and the display 900 can be mounted on the first linkage assembly 210 and the second linkage assembly 220 via the display fixing structure 300, such that the position of the display 900 relative to the wall can be adjusted with deployment and retraction of the first linkage assembly 210 and the second linkage assembly 220.

While the present disclosure has been described in detail above with reference to the exemplary embodiments, the scope of the present disclosure is not limited thereto. As will occur to those skilled in the art, the present disclosure is susceptible to various modifications and changes without departing from the spirit and principle of the present disclosure. Therefore, the scope of the present disclosure should be determined by the scope of the claims.

What is claimed is:

1. A display mounting device, comprising:
   a mounting structure, configured to fix to a load-bearing structure;
   a pantographic mechanism, comprising at least one first linkage assembly configured to be deployable and retractable, and at least one second linkage assembly configured to be deployable and retractable in synchronization with the at least one first linkage assembly; and
   a display fixing structure;
   wherein each of the at least one first linkage assembly has two ends respectively rotatably connected with the mounting structure and the display fixing structure, each of the at least one second linkage assembly has two ends respectively rotatably connected with the mounting structure and the display fixing structure, and a position of the display fixing structure relative to the mounting structure is configured to be adjusted with deployment and retraction of the at least one first linkage assembly and the at least one second linkage assembly;
   each of the at least one the first linkage assembly comprises a first front linkage element rotatably connected with the mounting structure and a first rear linkage element rotatably connected with the first front linkage element;
   each of the at least one the second linkage assembly comprises a second front linkage element rotatably connected with the mounting structure and a second rear linkage element rotatably connected with the second front linkage element;
   the display fixing structure is rotatably connected with the first rear linkage element and the second rear linkage element;
   the first front linkage element has a first groove, and an end of the first rear linkage element rotatably connected with the first front linkage element is received in the first groove; and
   the second front linkage element has a second groove, and an end of the second rear linkage element rotatably connected with the second front linkage element is received in the second groove.

2. The display mounting device of claim 1, wherein a rotation axis of the first front linkage element, a rotation axis of the second front linkage element, a rotation axis of the first rear linkage element, and the second rear linkage element are all disposed laterally.

3. The display mounting device of claim 1, wherein an end of the first front linkage element rotatably connected with the mounting structure is provided with a first front gear, an end of the second front linkage element rotatably connected with the mounting structure is provided with a second front gear, and the first front gear is engaged with the second front gear.

4. The display mounting device of claim 1, wherein an end of the first rear linkage element rotatably connected with the display fixing structure is provided with a first rear gear, an end of the second rear linkage element rotatably connected with the display fixing structure is provided with a second rear gear, and the first rear gear is engaged with the second rear gear.

5. The display mounting device of claim 1, wherein each of the at least one first linkage assembly further comprises at least one first intermediate linkage element rotatably connected with the first front linkage element and the first rear linkage element, each of the at least one second linkage assembly further comprises at least one second intermediate linkage element rotatably connected with the second front linkage element and the second rear linkage element, and each of the at least one first intermediate linkage element is rotatably connected with each of the at least one second intermediate linkage element.

6. The display mounting device of claim 1, wherein:
   each of the at least one first linkage assembly comprises a first front spacer received in the first groove and a first front pin extending through the first front linkage element and the first front spacer, and the first front pin is rotatably connected with the mounting structure; and
   each of the at least one second linkage assembly comprises a second front spacer received in the second groove and a second front pin extending through the second front linkage element and the second front spacer, and the second front pin is rotatably connected with the mounting structure.

7. The display mounting device of claim 1, wherein:
each of at least one the first linkage assembly comprises two first intermediate spacers received in the first groove and a first intermediate pin, the end of the first rear linkage element is clamped between the two first intermediate spacers, and the first intermediate pin extends through the first front linkage element, the first rear linkage element, and the two first intermediate spacers; and
each of the at least one second linkage assembly comprises two second intermediate spacers received in the second groove and a second intermediate pin, the end of the second rear linkage element is clamped between the two second intermediate spacers, and the second intermediate pin extends through the second front linkage element, the second rear linkage element, and the two second intermediate spacers.

8. The display mounting device of claim 7, wherein:
the first rear linkage element has a third groove, each of the at least one first linkage assembly further comprises a third intermediate spacer received in the third groove, and the first intermediate pin also extends through the third intermediate spacer; and
the second rear linkage element has a fourth groove, each of the at least one second linkage assembly further comprises a fourth intermediate spacer received in the fourth groove, and the second intermediate pin also extends through the fourth intermediate spacer.

9. The display mounting device of claim 1, wherein:
the mounting structure comprises a frame and two fixing members detachably connected with the frame, and the frame is configured to be fixed to the load-bearing structure; and
two first linkage assemblies are provided to respectively rotatably connect with the two fixing members, and two second linkage assemblies are provided to respectively rotatably connect with the two fixing members.

10. The display mounting device of claim 9, wherein:
the frame comprises a first beam and a second beam disposed opposite the first beam, and two opposite vertical rods fixedly connected to the first beam and the second beam, and each of the two fixing members has an end provided with a hook configured to be mounted to the first beam, and another end provided with a recess configured to be engaged with the second beam.

11. The display mounting device of claim 10, wherein:
the mounting structure further comprises a displacement adjustment member connected to each of the two fixing members to be slidable in longitudinal direction of each of the two fixing members, the displacement adjustment member is configured to be abutted against the first beam, and a position of each of the two fixing members relative to the mounting structure is configured to be adjusted by adjusting a position of the displacement adjustment member relative to each of the two fixing members.

12. The display mounting device of claim 10, wherein the mounting structure further comprises a retaining member connected to each of the two fixing members to be slidable in longitudinal direction of each of the two fixing members and an elastic member elastically connected between each of the two fixing members and the retaining member, and the retaining member is configured to abut against the second beam under elastic force of the elastic member.

13. The display mounting device of claim 1, wherein:
the display fixing structure comprises two supporting members arranged in parallel, each of the two supporting members is configured to fixedly connect with display;
each of the two supporting members is respectively rotatably connected with an end of each of the at least one first linkage assembly away from the mounting structure and an end of each of the at least one second linkage assembly away from the end of the mounting structure; and
longitudinal direction of each of the two supporting members is perpendicular to at least one rotation axis of each of the at least one first linkage assembly.

14. A display mounting device, wherein:
a mounting structure, configured to fix to a load-bearing structure;
a pantographic mechanism, comprising at least one first linkage assembly configured to be deployable and retractable, and at least one second linkage assembly configured to be deployable and retractable in synchronization with the at least one first linkage assembly; and
a display fixing structure;
wherein each of the at least one first linkage assembly has two ends respectively rotatably connected with the mounting structure and the display fixing structure, each of the at least one second linkage assembly has two ends respectively rotatably connected with the mounting structure and the display fixing structure, and a position of the display fixing structure relative to the mounting structure is configured to be adjusted with deployment and retraction of the at least one first linkage assembly and the at least one second linkage assembly;
the display fixing structure comprises two supporting members arranged in parallel, each of the two supporting members is configured to fixedly connect with a display;
each of the two supporting members is respectively rotatably connected with an end of each of the at least one first linkage assembly away from the mounting structure and an end of each of the at least one second linkage assembly away from the end of the mounting structure;
a longitudinal direction of each of the two supporting members is perpendicular to at least one rotation axis of each of the at least one first linkage assembly;
the display fixing structure further comprises two tilting adjustment seats;
each of the two tilting adjustment seats is rotatably connected with an end of first rear linkage element away from the mounting structure and an end of second rear linkage element away from the mounting structure respectively at two positions between two ends of each of the two tilting adjustment seats; and
an end of each of the two tilting adjustment seats close to the second rear linkage element is rotatably connected with one of the two supporting members, another end of each of the two tilting adjustment seats close to the first rear linkage element is configured to deploy and retract relative to the one of the two supporting members, such that a tilting position of the one of the two supporting members relative to one of the two tilting adjustment seats is adjustable.

15. The display mounting device of claim 14, wherein each of the two supporting members is provided with an arcuate slot, and each of the two tilting adjustment seats is provided with a pin slidably coupled to the arcuate slot.

16. The display mounting device of claim 14, wherein each of the two tilting adjustment seats is provided with a groove, the end of the first rear linkage element away from the mounting structure and the end of the second rear linkage element away from the mounting structure are received in the groove.

17. The display mounting device of claim 14, wherein each of the two supporting member is provided with a supporting groove, and the end of each of the two tilting adjustment seats rotatably connected with the one of the two supporting members is received in the supporting groove.

18. A display mounting device, wherein:
a mounting structure, configured to fix to a load-bearing structure;
a pantographic mechanism, comprising at least one first linkage assembly configured to be deployable and retractable, and at least one second linkage assembly configured to be deployable and retractable in synchronization with the at least one first linkage assembly; and
a display fixing structure;
wherein each of the at least one first linkage assembly has two ends respectively rotatably connected with the mounting structure and the display fixing structure, each of the at least one second linkage assembly has two ends respectively rotatably connected with the mounting structure and the display fixing structure, and a position of the display fixing structure relative to the mounting structure is configured to be adjusted with deployment and retraction of the at least one first linkage assembly and the at least one second linkage assembly;

the mounting structure comprises a frame and two fixing members detachably connected with the frame, and the frame is configured to be fixed to the load-bearing structure; and two first linkage assemblies are provided to respectively rotatably connect with the two fixing members, and two second linkage assemblies are provided to respectively rotatably connect with the two fixing members; and the frame comprises a first beam and a second beam disposed opposite the first beam, and two opposite vertical rods fixedly connected to the first beam and the second beam, and each of the two fixing members has an end provided with a hook configured to be mounted to the first beam, and another end provided with a recess configured to be engaged with the second beam;

each of the two fixing members has a groove, and an end of a first front linkage element rotatably connected with the mounting structure and an end of a second front linkage element rotatably connected with the mounting structure are received in the groove; and in a retracted state of the at least one first linkage assembly and the at least one second linkage assembly, another end of the first front linkage element rotatably connected with a first rear linkage element is at least partially received in the groove and another end of the second front linkage element rotatably connected with a second rear linkage element is at least partially received in the groove.

* * * * *